United States Patent
Yagi et al.

(10) Patent No.: US 11,837,620 B2
(45) Date of Patent: Dec. 5, 2023

(54) PHOTO RECEIVER

(71) Applicant: SUMITOMO ELECTRIC INDUSTRIES, LTD., Osaka (JP)

(72) Inventors: Hideki Yagi, Osaka (JP); Takuya Okimoto, Osaka (JP); Munetaka Kurokawa, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 502 days.

(21) Appl. No.: 17/158,537

(22) Filed: Jan. 26, 2021

(65) Prior Publication Data

US 2021/0242268 A1 Aug. 5, 2021

(30) Foreign Application Priority Data

Jan. 30, 2020 (JP) .................. 2020-013722

(51) Int. Cl.
*H01L 27/146* (2006.01)

(52) U.S. Cl.
CPC .. *H01L 27/14636* (2013.01); *H01L 27/14641* (2013.01)

(58) Field of Classification Search
CPC ....... H01L 31/12–173; H01L 27/14634; H01L 27/14636; H01L 27/14641
See application file for complete search history.

(56) References Cited

U.S. PATENT DOCUMENTS

| 2012/0093457 A1* | 4/2012 | Sakamaki | H04B 10/65 385/14 |
| 2017/0131473 A1* | 5/2017 | Masuyama | H01L 31/02005 |

FOREIGN PATENT DOCUMENTS

| JP | 2017-032629 | 2/2017 |
| JP | 2017-92137 | 5/2017 |
| WO | 2017/017965 | 2/2017 |

OTHER PUBLICATIONS

Runge, Patrick, et al., Monolithic InP Receiver Chip With a Variable Optical Attenuator for Colorless WDM Detection, *IEEE Photonics Technology Letters*, vol. 26, No. 4, Feb. 15, 2014, p. 349–p. 351.

* cited by examiner

*Primary Examiner* — Tucker J Wright
(74) *Attorney, Agent, or Firm* — SMITH, GAMBRELL & RUSSELL, LLP.

(57) ABSTRACT

A photo receiver includes a photo detector including a semiconductor substrate having a first main surface and a second main surface and a metal pattern layer provided on the second main surface; and a carrier including a supporting substrate having a third main surface facing the second main surface and a solder pattern layer provided on the third main surface. The solder pattern layer is bonded to the metal pattern layer. The first main surface is provided with a variable optical attenuator, an optical 90-degree hybrid device, and a plurality of photodiodes optically coupled to the variable optical attenuator via the optical 90-degree hybrid device. The solder pattern layer and the metal pattern layer are located in a peripheral area surrounding a central area where the variable optical attenuator and the optical 90-degree hybrid device are located when viewed in the normal direction of the first main surface.

5 Claims, 11 Drawing Sheets

PHOTO RECEIVER

CROSS REFERENCE TO RELATED APPLICATIONS

This application claims priority based on Japanese Patent Application No. 2020-013722 filed on Jan. 30, 2020, and the entire contents of the Japanese patent application are incorporated herein by reference.

TECHNICAL FIELD

The present disclosure relates to a photo receiver.

BACKGROUND

Non Patent Document1 (Patrick Runge et al., "Monolithic InP Receiver Chip With a Variable Optical Attenuator for Colorless WDM Detection", IEEE PHOTONICS TECHNOLOGY LETTERS, VOL. 26, NO. 4, Feb. 15, 2014) discloses a photo detector in which a variable optical attenuator (VOA), an optical 90-degree hybrid device and a plurality of photodiodes are monolithically integrated on an InP-substrate.

Patent Document1 (Japanese Laid-open Patent Publication No. 2017-92137) discloses a mounting substrate for mounting a semiconductor optical device. A solder layer is provided on the main surface of the mounting substrate.

SUMMARY

A photo receiver according to an aspect of the present disclosure includes a photo detector including a semiconductor substrate having a first main surface and a second main surface opposite to the first main surface and a metal pattern layer provided on the second main surface; and a carrier including a supporting substrate having a third main surface facing the second main surface and a solder pattern layer provided on the third main surface. The solder pattern layer is bonded to the metal pattern layer. In the photo receiver, the first main surface is provided with a variable optical attenuator, an optical 90-degree hybrid device, and a plurality of photodiodes optically coupled to the variable optical attenuator via the optical 90-degree hybrid device, and the solder pattern layer and the metal pattern layer are located in a peripheral area surrounding a central area where the variable optical attenuator and the optical 90-degree hybrid device are located when viewed in the normal direction of the first main surface.

BRIEF DESCRIPTION OF THE DRAWINGS

The foregoing and other purposes, aspects and advantages will be better understood from the following detailed description of a preferred embodiment of the invention with reference to the drawings.

DETAILED DESCRIPTION

Figure 1:
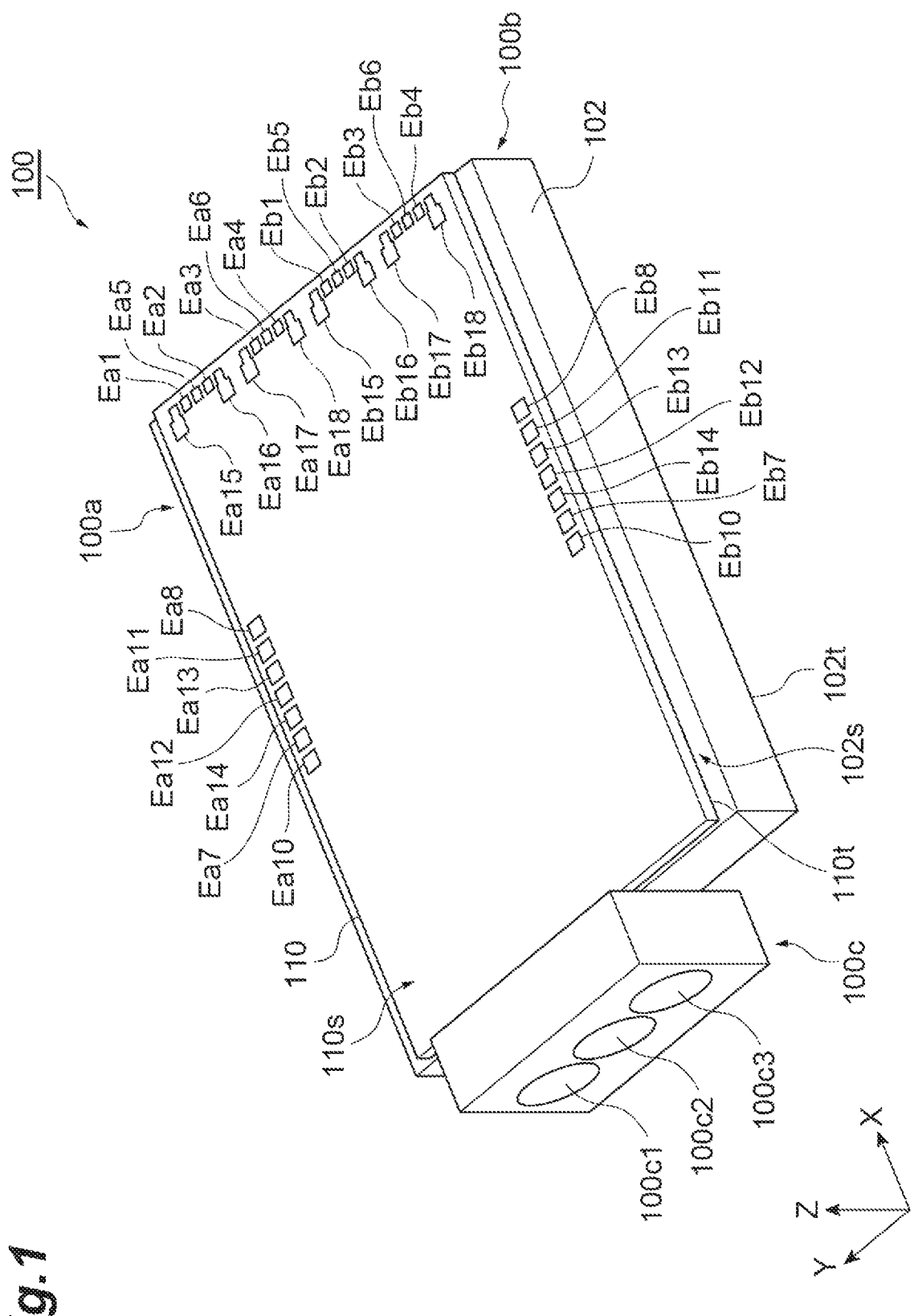
FIG. 1 is a perspective view schematically showing a photo receiver according to an embodiment.

When a photo detector of Non-Patent Document 1 is mounted on a mounting substrate, a solder layer on the main surface of the mounting substrate is melted to bond the molten solder layer to a metal layer provided on the entire back surface of the photo detector. The greater the bonding area between the metal layer and the solder layer, the greater the stress to which the photo detector is subjected. Therefore, it is conceivable to provide the solder layer only on a part of the main surface of the mounting substrate. However, as the solder layer is melted, a molten solder may migrate along the surface of the metal layer. As a result, the bonding area between the metal layer and the solder layer may increase.

The present disclosure provides a photo receiver in which the bonding area of a metal layer and a solder layer is reduced.

Description of Embodiments of the Present Disclosure

A photo receiver according to an embodiment includes a photo detector including a semiconductor substrate having a first main surface and a second main surface opposite to the first main surface and a metal pattern layer provided on the second main surface; and a carrier including a supporting substrate having a third main surface facing the second main surface and a solder pattern layer provided on the third main surface. The solder pattern layer is bonded to the metal pattern layer. The first main surface is provided with a variable optical attenuator, an optical 90-degree hybrid device, and a plurality of photodiodes optically coupled to the variable optical attenuator via the optical 90-degree hybrid device, and the solder pattern layer and the metal pattern layer are located in a peripheral area surrounding a central area where the variable optical attenuator and the optical 90-degree hybrid device are located when viewed in the normal direction of the first main surface.

According to the photo receiver, by melting the solder pattern layer, the solder pattern layer and the metal pattern layer are bonded to each other. At this time, since the solder pattern layer and the metal pattern layer are located in the peripheral area, a molten solder is prevented from moving from the peripheral area to the central area along the surface of the metal pattern layer. Therefore, the bonding area between the solder pattern layer and the metal pattern layer can be reduced. Therefore, the stress to which the photo detector is subjected can be reduced.

The first main surface may be provided with an input port into which a local oscillation light is inputted. The input port may be optically coupled to the optical 90-degree hybrid device. Each of the solder pattern layer and the metal pattern layer may include a portion adjacent to the input port when viewed in the normal direction of the first main surface.

In this instance, the solder pattern layer and the metal pattern layer are bonded to each other in the portions adjacent to the input port when viewed in the normal direction of the first main surface. Therefore, the warpage of the photo detector due to thermal expansion is suppressed in the portions adjacent to the input port.

In the first main surface, the variable optical attenuator and the optical 90-degree hybrid device may be arranged in a first direction. The solder pattern layer may have a pair of first portions extending along the first direction and a second portion connecting the pair of the first portions, when viewed in the normal direction of the first main surface. The metal pattern layer may have a pair of third portions extending along the first direction and a fourth portion disposed apart from the pair of the third portions, when viewed in the normal direction of the first main surface.

In this instance, since the fourth portion of the metal pattern layer is disposed apart from the pair of the third portions, the metal pattern layer is not bonded to the solder pattern layer in a spaced area between the pair of the third portions and the fourth portion. Therefore, the bonding area between the metal pattern layer and the solder pattern layer can be further reduced. Therefore, the stress to which the photo detector is subjected can be reduced.

The second portion may extend along a direction intersecting the first direction when viewed in the normal direction of the first main surface. The fourth portion may extend along a direction intersecting the first direction when viewed in the normal direction of the first main surface. The extending directions of the second portion and the fourth portion may be the same or different from each other.

In this instance, the second portion and the fourth portion extend in the direction intersecting the first direction, so that the metal pattern layer and the solder pattern layer as a whole can have a linear symmetry with respect to the symmetric axis extending in the first direction. Thus, the stress to which the two variable optical attenuators are subjected can be made symmetrical, for example when the two variable optical attenuators have a linear symmetry with respect to the symmetric axis.

Details of Embodiments of the Present Disclosure

Hereinafter, embodiments according to the present disclosure will be described in detail with reference to the drawings. In the description of the drawings, like or corresponding elements are denoted by like reference numerals and redundant descriptions thereof will be omitted. In the drawings, XYZ coordinate system is shown as necessary. The X-axis direction (first direction), the Y-axis direction (second direction) and the Z-axis direction intersect each other (e.g., perpendicularly).

Figure 2:
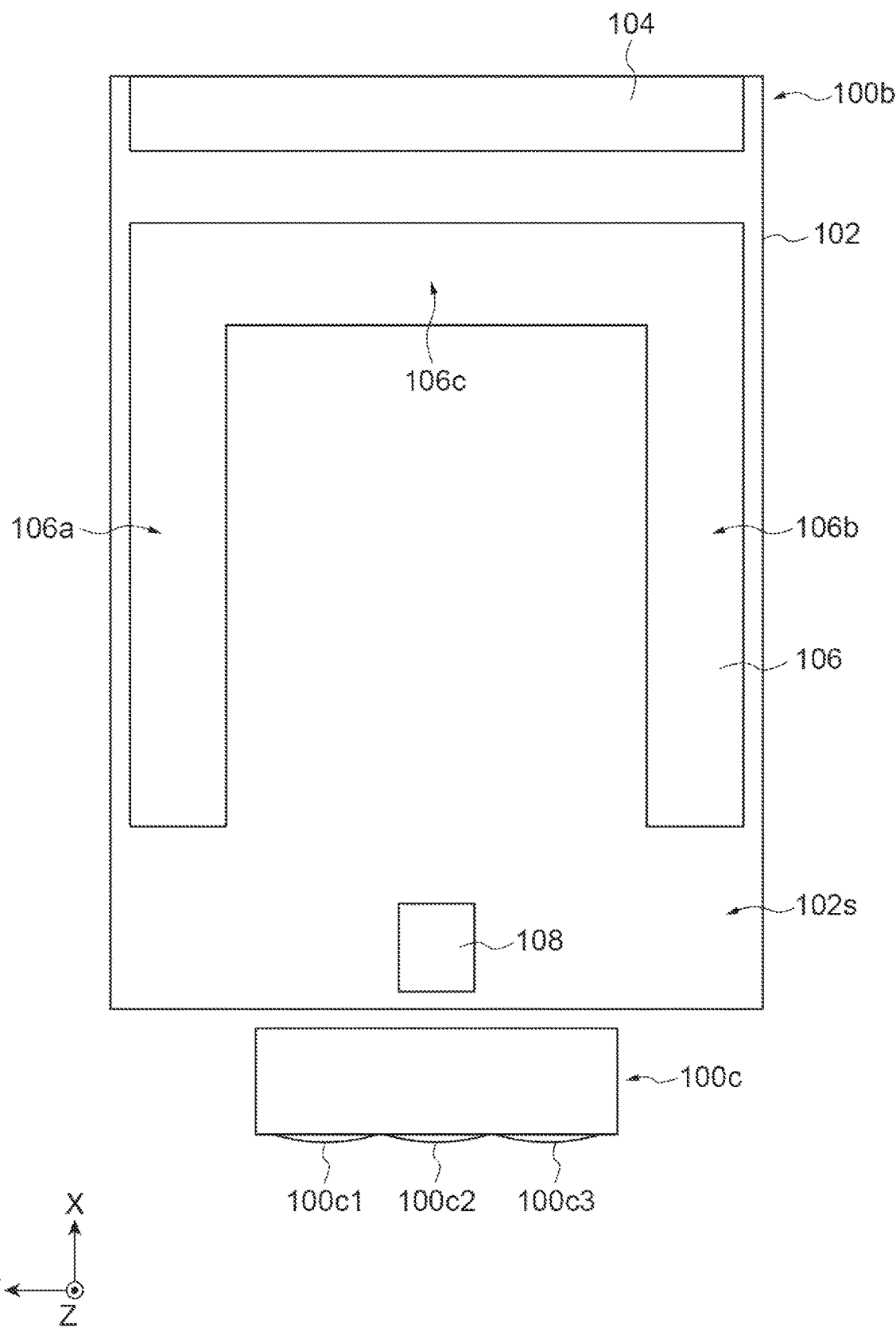
FIG. 2 is a plan view schematically showing a carrier and a lens array of a photo receiver according to an embodiment.
Figure 3:
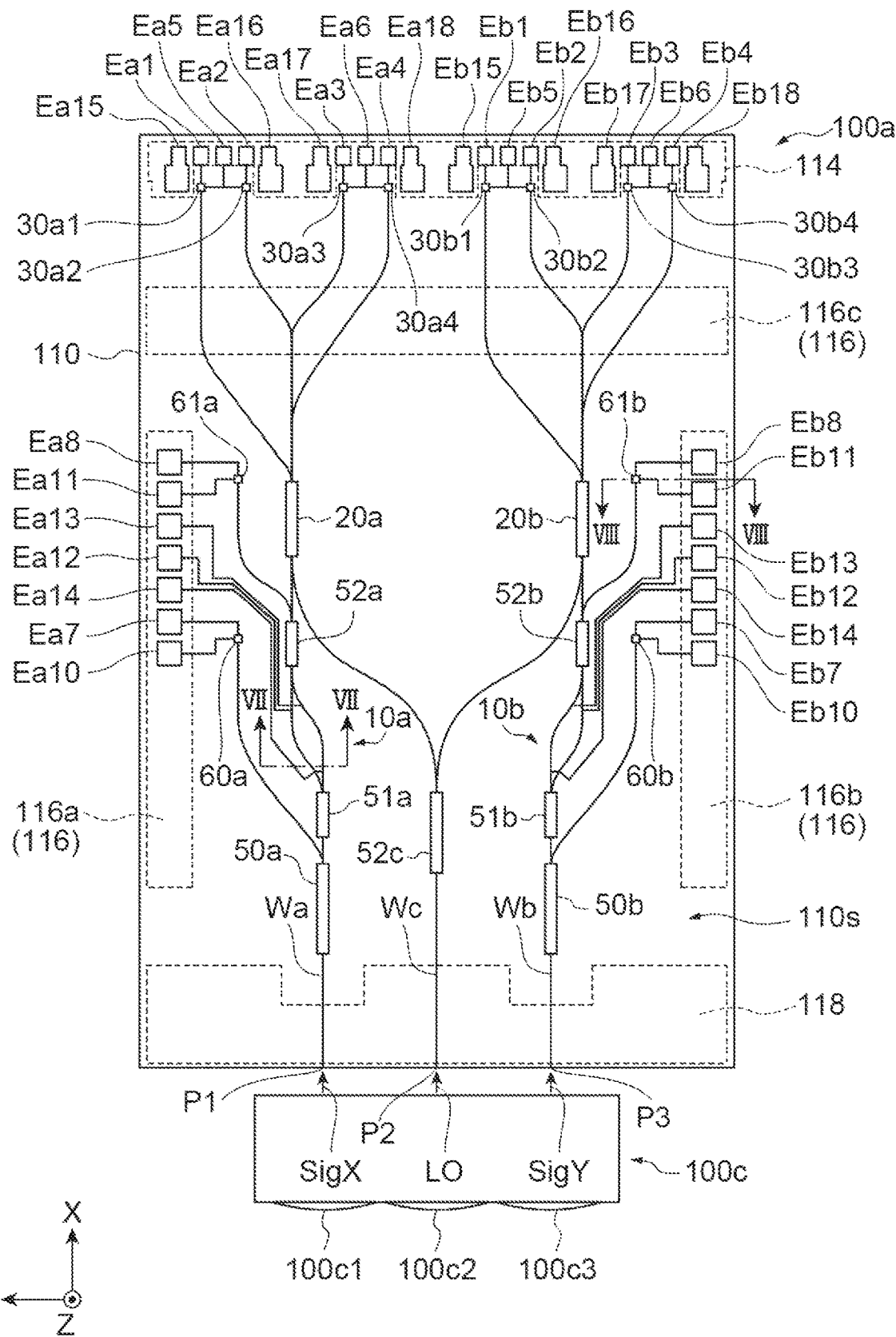
FIG. 3 is a plan view schematically showing a photo detector and a lens array of a photo receiver according to an embodiment.
Figure 4:
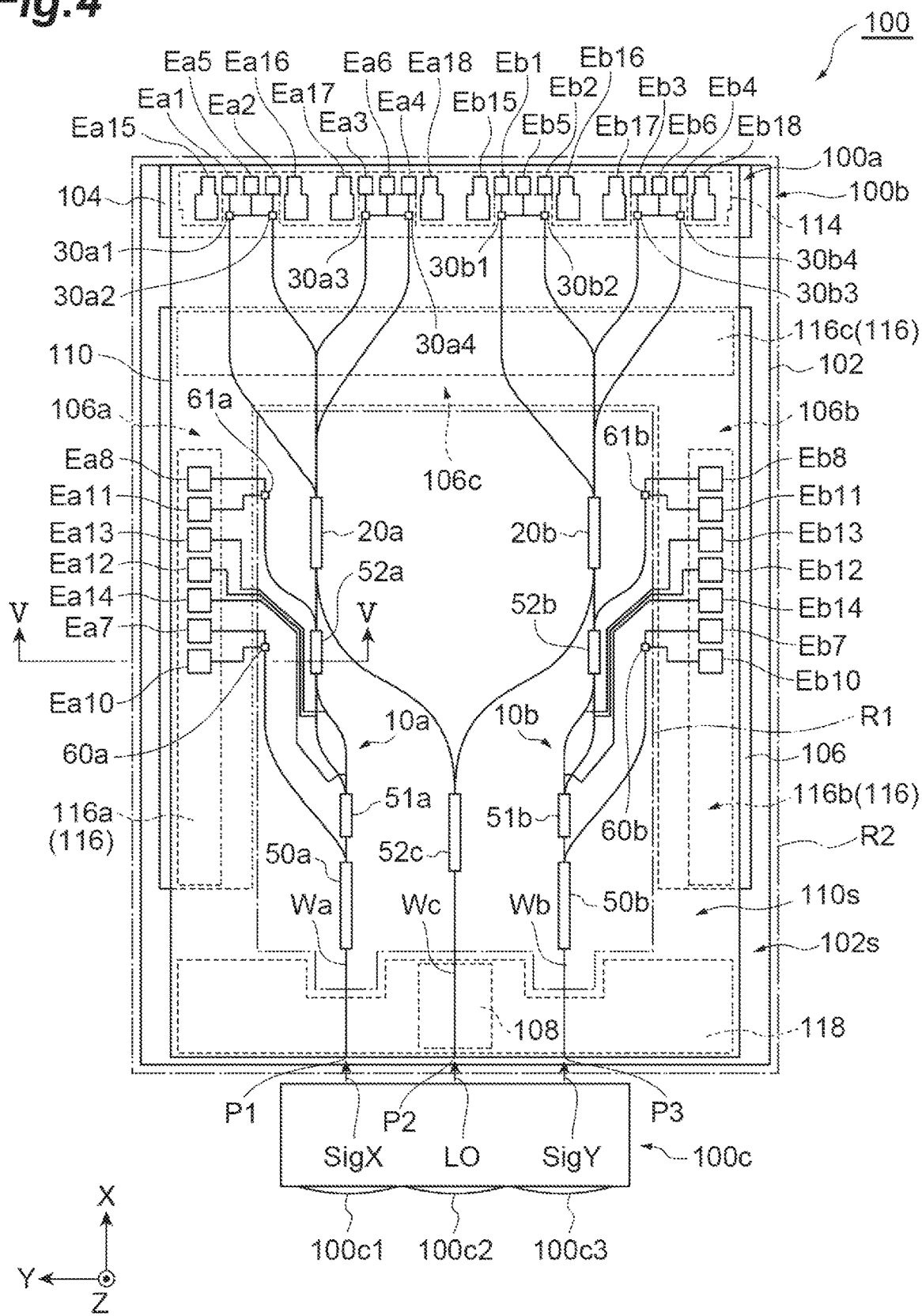
FIG. 4 is a plan view schematically showing a photo receiver according to an embodiment.
Figure 5:
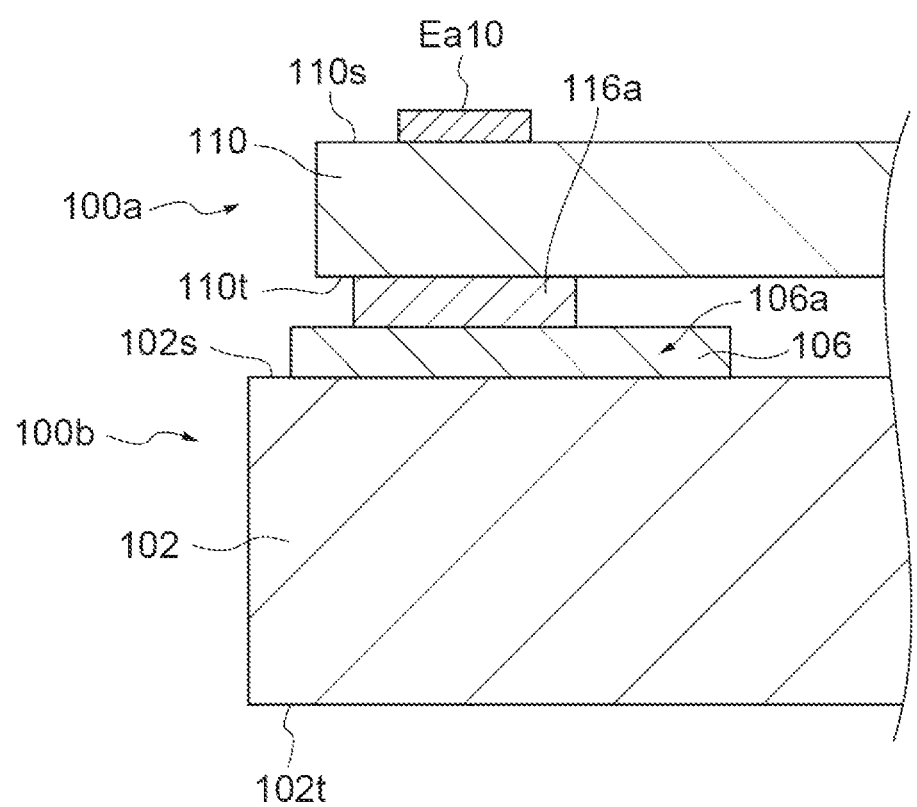
FIG. 5 is a cross-sectional view taken along the line V-V in FIG. 4.
Figure 6:
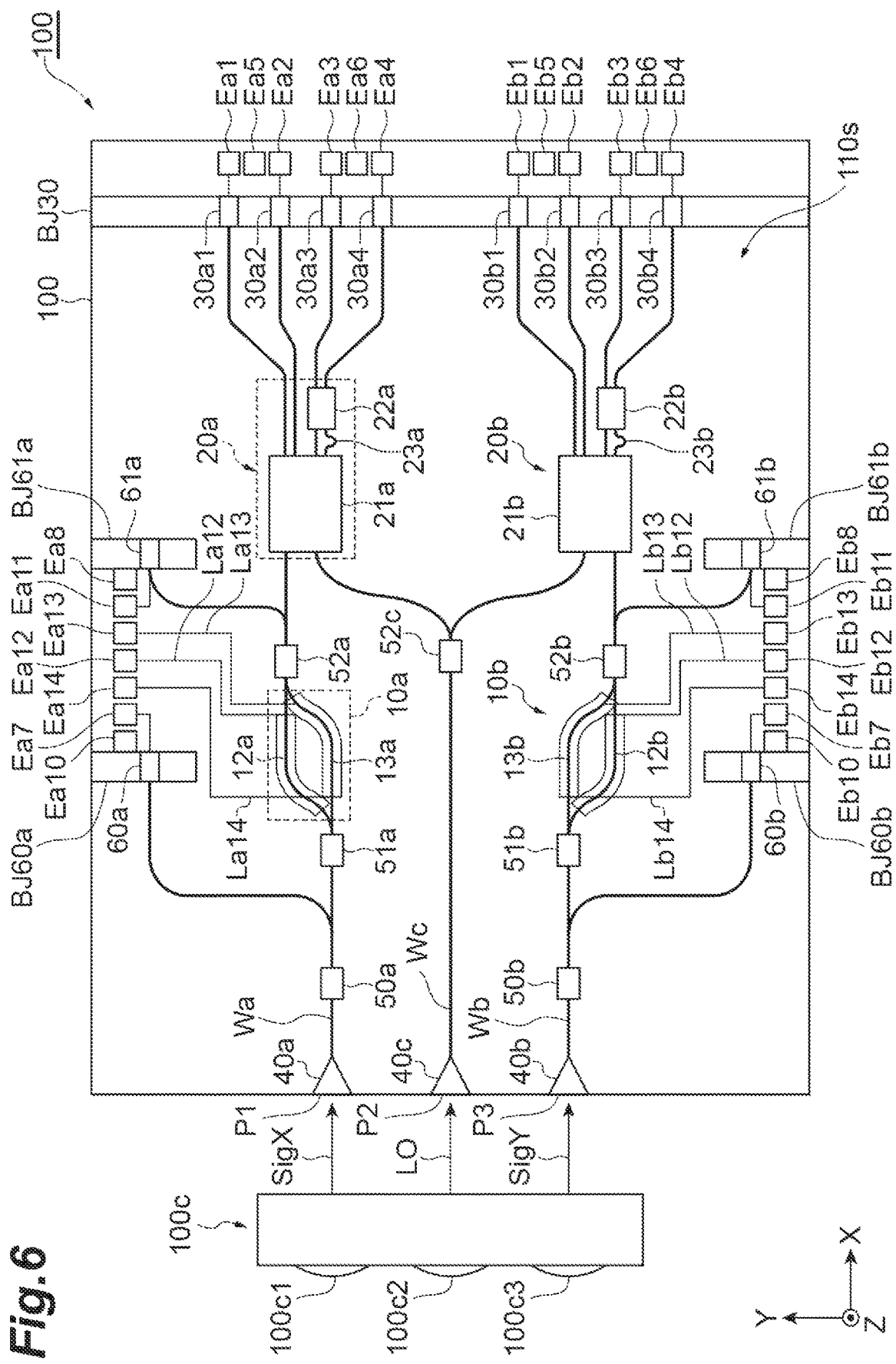
FIG. 6 is a plan view schematically showing a photo receiver according to an embodiment.

FIG. 1 is a perspective view schematically showing a photo receiver according to an embodiment. FIG. 2 is a plan view schematically showing a carrier and a lens array of a photo receiver according to an embodiment. FIG. 3 is a plan view schematically showing a photo detector and a lens array of a photo receiver according to an embodiment. FIGS. 4 and 6 are plan views schematically showing a photo receiver according to an embodiment. FIG. 5 is a cross-sectional view taken along the line V-V in FIG. 4.

A photo receiver 100 shown in FIGS. 1, 4 and 6 is used for coherent optical communication or the like. The photo receiver 100 includes a photo detector 100a and a carrier 100b. The photo detector 100a and the carrier 100b are arranged along the Z-axis direction. In FIG. 2, the photo detector 100a is omitted. In FIG. 3, the carrier 100b is omitted. The photo receiver 100 may include a lens array 100c. The lens array 100c and the photo detector 100a are arranged along the X-axis direction. The lens array 100c includes a plurality of lenses, for example, three lenses 100c1, 100c2, and 100c3. The lenses 100c1, 100c2, and 100c3 are arranged along the Y-axis direction. The lens 100c2 is disposed between the lens 100c1 and the lens 100c3.

The photo detector 100a includes a semiconductor substrate 110 having a first main surface 110s and a second main surface 110t opposite the first main surface 110s and metal pattern layers 114, 116, and 118 provided on the second main surface 110t (see FIG. 3). Each of the first main surface 110s and the second main surface 110t extends in the X-axis direction and the Y-axis direction, and have a rectangular shape, for example. The semiconductor substrate 110 is, for example, a III-V group compound semiconductor substrate such as an InP-substrate. The thickness of the semiconductor substrate 110 may be 100 μm or more and 200 μm or less. The metal pattern layers 114, 116, and 118 contain gold, for example.

Hereinafter, elements integrated in the first main surface 110s of the photo detector 100a will be described mainly referring to FIG. 6.

A plurality (e.g., three) of input ports P1, P2, and P3, a plurality (e.g., two) of variable optical attenuators (VOA) 10a and 10b, a plurality (e.g., two) of optical 90-degree hybrid devices 20a and 20b, and a plurality (e.g., eight) of photodiodes 30a1, 30a2, 30a3, 30a4, 30b1, 30b2, 30b3, and 30b4 are provided in the first main surface 110s. The variable optical attenuators 10a and 10b, the optical 90-degree hybrid devices 20a and 20b, and the photodiodes 30a1 to 30a4 and 30b1 to 30b4 are monolithically integrated in the first main surface 110s. In the first main surface 110s, the input port P1, the variable optical attenuator 10a, the optical 90-degree hybrid device 20a and the photodiodes 30a1 to 30a4 are arranged in the first direction (X-axis direction). Similarly, in the first main surface 110s, the input port P3, the variable optical attenuator 10b, the optical 90-degree hybrid device 20b and the photodiodes 30b1 to 30b4 are arranged in the X-axis direction.

A plurality (e.g., four) of the photodiodes 30a1 to 30a4 are optically coupled to the variable optical attenuator 10a via the optical 90-degree hybrid device 20a. Each of the plurality of photodiodes 30a1 to 30a4 is connected to the optical 90-degree hybrid device 20a by an optical waveguide. The optical 90-degree hybrid device 20a is optically coupled to the variable optical attenuator 10a via an optical demultiplexer 52a such as a two-input-two-output multimode interference (MMI) coupler. The variable optical attenuator 10a is optically coupled to a spot-size converter 40a via optical demultiplexers 50a and 51a such as one-input-two-output MMI couplers. The spot-size converter 40a is located on the edge (the edge extending along the Y-axis) of the first main surface 110s.

A plurality (e.g., four) of the photodiodes 30b1 to 30b4 are optically coupled to the variable optical attenuator 10b via the optical 90-degree hybrid device 20b. Each of the plurality of photodiodes 30b1 to 30b4 is connected to the optical 90-degree hybrid device 20b by an optical waveguide. The optical 90-degree hybrid device 20b is optically coupled to the variable optical attenuator 10b via an optical demultiplexer 52b such as a two-input-two-output MMI coupler. The variable optical attenuator 10b is optically coupled to a spot-size converter 40b via optical demultiplexers 50*b* and 51*b* such as one-input-two-output MMI couplers. The spot-size converter 40*b* is located on the edge (the edge extending along the Y-axis) of the first main surface 110*s*.

The optical 90-degree hybrid devices 20*a* and 20*b* are optically coupled to a spot-size converter 40*c* via an optical demultiplexer 52*c* such as a one-input-two-output MMI coupler. The spot-size converter 40*c* is located on the edge (the edge extending along the Y-axis) of the first main surface 110*s*. The spot-size converter 40*c* is located between the spot-size converter 40*a* and the spot-size converter 40*b* in the Y-axis direction.

The spot-size converter 40*a* functions as the input port P1 to which a first signal light SigX is inputted from the lens 100*c*1. The spot-size converter 40*b* functions as the input port P3 to which a second signal light SigY is inputted from the lens 100*c*3. The spot-size converter 40*c* functions as the input port P2 to which a local oscillation light LO is inputted from the lens 100*c*2. The spot-size converters 40*a*, 40*b*, and 40*c* can widen the optical mode diameter.

The first signal light SigX is, for example, X-polarized waves having the same wavelengths and four phases that differ from each other. The second signal light SigY is, for example, Y-polarized waves having the same wavelengths and four phases that differ from each other. Each of the first signal light SigX and the second signal light SigY is a signal light modulated by a quadrature phase shift keying (QPSK) method, for example. Each of the first signal light SigX and the second signal light SigY is wavelength-multiplexed in the wavelength range of 1530 nm to 1570 nm, which is the C-band set forth in the International Telecommunication Union Telecommunication Standardization Sector (ITU-T). The local oscillation light LO has the same wavelength as the respective wavelength of the first signal light SigX and the second signal light SigY, for example.

An output end of the spot-size converter 40*a* is connected to the input end of the optical demultiplexer 50*a* by an optical waveguide Wa.

The first output end of the optical demultiplexer 50*a* is connected to the input end of the optical demultiplexer 51*a* by an optical waveguide. The second output end of the optical demultiplexer 50*a* is connected to a photodiode 60*a* by an optical waveguide. The anode of the photodiode 60*a* is electrically connected to an electrode pad Ea7 via an anode electrode, for example. The cathode of the photodiode 60*a* is electrically connected to an electrode pad Ea100 via a cathode electrode, for example. The photodiode 60*a* monitors the magnitude of the first signal light SigX. The photodiode 60*a* is a PIN photodiode or the like. The photodiode 60*a* is located in an area BJ60*a* that defines butt joint coupling.

The first output end and the second output end of the optical demultiplexer 51*a* are connected to the input end of the variable optical attenuator 10*a* by an optical waveguide. The variable optical attenuator 10*a* is an optical attenuator of the Mach-Zehnder type, for example. The variable optical attenuator 10*a* includes heaters 12*a* and 13*a* configured to heat the first and second arm optical waveguides, respectively. The heaters 12*a* and 13*a* extend along the first and second arm optical waveguides, respectively. One end of the heater 12*a* is electrically connected to an electrode pad Ea12 by a conductive line La12. The other end of the heater 12*a* is electrically connected to an electrode pad Ea14 by a conductive line La14. One end of the heater 13*a* is electrically connected to an electrode pad Ea13 by a conductive line La13. The other end of the heater 13*a* is electrically connected to an electrode pad Ea14 by a conductive line La14. The output end of the variable optical attenuator 10*a* is connected to the input end of the optical demultiplexer 52*a* by an optical waveguide. The first output end of the optical demultiplexer 52*a* is connected to the first input end of the optical 90-degree hybrid device 20*a* by an optical waveguide. The second output end of the optical demultiplexer 52*a* is connected to a photodiode 61*a* by an optical waveguide. The anode of the photodiode 61*a* is electrically connected to an electrode pad Ea11 via an anode electrode, for example. The cathode of the photodiode 61*a* is electrically connected to electrode pad Ea8 via a cathode electrode, for example. The electrode pad Ea8 and the electrode pad Ea11 are electrically connected to a signal processor (not shown) provided outside the photo receiver 100 using wire bonding. By detecting the magnitude of the electric signal using the signal processor, the magnitude of the first signal light SigX outputted from the variable optical attenuator 10*a* is indirectly monitored. The photodiode 61*a* is a PIN photodiode, for example. The photodiode 61*a* is located in an area BJ61*a* that defines butt-joint coupling.

The optical 90-degree hybrid device 20*a* includes a 2-input-4-output MMI coupler 21*a* and a 2-input-2-output MMI coupler 22*a*, for example. The first input end of the MMI coupler 21*a* is the first input end of the optical 90-degree hybrid device 20*a*. The second input end of the MMI coupler 21*a* is the second input end of the optical 90-degree hybrid device 20*a*. Two output ends out of the four output ends in the MMI coupler 21*a* are each coupled to the two input ends of the MMI coupler 22*a* via optical waveguides. The optical path lengths of these two optical waveguides are different from each other. In a phase shift portion 23*a*, one optical waveguide is curved away from the other optical waveguide so that one optical waveguide is slightly longer than the other optical waveguide. As a result, the signal component propagating in one optical waveguide has a delay corresponding to a phase of 45° with respect to the signal component propagating in the other optical waveguide. The other two output ends of the MMI coupler 21*a* are connected to the photodiodes 30*a*1 and 30*a*2 by optical waveguides, respectively. The anode of the photodiode 30*a*1 is electrically connected to an electrode pad Ea1. The cathode of the photodiode 30*a*1 is electrically connected to an electrode pad Ea5. The anode of the photodiode 30*a*2 is electrically connected to an electrode pad Ea2. The cathode of the photodiode 30*a*2 is electrically connected to an electrode pad Ea5. Two output ends of the MMI coupler 22*a* are connected to the photodiodes 30*a*3 and 30*a*4 by optical waveguides, respectively. The anode of the photodiode 30*a*3 is electrically connected to an electrode pad Ea3. The cathode of the photodiode 30*a*3 is electrically connected to an electrode pad Ea6. The anode of the photodiode 30*a*4 is electrically connected to an electrode pad Ea4. The cathode of the photodiode 30*a*4 is electrically connected to an electrode pad Ea6. The electrode pads Ea1 to Ea6 are electrically connected to a transimpedance amplifier (TIA) (not shown) provided outside the photo receiver 100 using wire bonding. The TIA detects the electric signal from each photodiode, thereby detecting the intensity of the light entering each of photodiodes 30*a*1 to 30*a*4. The photodiodes 30*a*1 to 30*a*4 are located in the area BJ30 that defines butt-joint coupling. The photodiodes 30*a*1 to 30*a*4 are PIN photodiodes, for example. The first main surface 110*s* is provided with electrode pads Ea15, Ea16, Ea17 and Ea18. These electrode pads are electrically connected to a ground electrode of the TIA using wire bonding.

The output end of the spot-size converter 40*b* is connected to the input end of the optical demultiplexer 50*b* by an optical waveguide Wb. The first output end of the optical demultiplexer 50b is connected to the input end of the optical demultiplexer 51b by an optical waveguide. The second output end of the optical demultiplexer 50b is connected to a photodiode 60b by an optical waveguide. The anode of the photodiode 60b is electrically connected to an electrode pad Eb7 via an anode electrode, for example. The cathode of the photodiode 60b is electrically connected to an electrode pad Eb10 via a cathode electrode, for example. The photodiode 60b monitors the magnitude of the second signal light SigY. The photodiode 60b is a PIN photodiode, for example. The photodiode 60b is located in an area BJ60b that defines butt-joint coupling.

The first output end and the second output end of the optical demultiplexer 51b are connected to the input end of the variable optical attenuator 10b by optical waveguides. The variable optical attenuator 10b is an optical attenuator of the Mach-Zehnder type, for example. The variable optical attenuator 10b includes heaters 12b and 13b configured to heat the first and second arm optical waveguides, respectively. The heaters 12b and 13b extend along the first and second arm optical waveguides, respectively. One end of the heater 12b is electrically connected to an electrode pad Eb12 by a conductive line Lb12. The other end of the heater 12b is electrically connected to an electrode pad Eb14 by a conductive line Lb14. One end of the heater 13b is electrically connected to an electrode pad Eb13 by a conductive line Lb13. The other end of the heater 13b is electrically connected to an electrode pad Eb14 by a conductive line Lb14. The output end of the variable optical attenuator 10b is connected to the input end of the optical demultiplexer 52b by an optical waveguide. The first output end of the optical demultiplexer 52b is connected to the first input end of the optical 90-degree hybrid device 20b by an optical waveguide. The second output end of the optical demultiplexer 52b is connected to a photodiode 61b by an optical waveguide. The anode of the photodiode 61b is electrically connected to an electrode pad Eb11 via an anode electrode, for example. The cathode of the photodiode 61b is electrically connected to an electrode pad Eb8 via a cathode electrode, for example. The electrode pads Eb8 and Eb11 are electrically connected to the signal processor (not shown) provided outside the photo receiver 100 using wire bonding. By detecting the magnitude of the electric signal using the signal processor, the magnitude of the second signal light SigY outputted from the variable optical attenuator 10b is indirectly monitored. The photodiode 61b is a PIN photodiode, for example. The photodiode 61b is located in an area BJ61b that defines butt-joint coupling.

The optical 90-degree hybrid device 20b includes, for example, a 2-input-4-output MMI coupler 21b and a 2-input-2-output MMI coupler 22b. The first input end of the MMI coupler 21b is the first input end of the optical 90-degree hybrid device 20b. The second input end of the MMI coupler 21b is the second input end of the optical 90-degree hybrid device 20b. Two output ends out of the four output ends in the MMI coupler 21b are each coupled to two input ends of the MMI coupler 22b via optical waveguides. The optical path lengths of these two optical waveguides are different from each other. In a phase shift portion 23b, one optical waveguide is curved away from the other optical waveguide so that one optical waveguide is slightly longer than the other optical waveguide. As a result, the signal component propagating in one optical waveguide has a delay corresponding to a phase of 45° with respect to the signal component propagating in the other optical waveguide. The other two output ends of the MMI coupler 21b are connected to the photodiodes 30b1 and 30b2 by optical waveguides, respectively. The anode of the photodiode 30b1 is electrically connected to an electrode pad Eb1. The cathode of the photodiode 30b1 is electrically connected to an electrode pad Eb5. The anode of the photodiode 30b2 is electrically connected to an electrode pad Eb2. The cathode of the photodiode 30b2 is electrically connected to an electrode pad Eb5. Two output ends of the MMI coupler 22b are connected to the photodiodes 30b3 and 30b4 by optical waveguides, respectively. The anode of the photodiode 30b3 is electrically connected to an electrode pad Eb3. The cathode of the photodiode 30b3 is electrically connected to an electrode pad Eb6. The anode of the photodiode 30b4 is electrically connected to an electrode pad Eb4. The cathode of the photodiode 30b4 is electrically connected to an electrode pad Eb6. The electrode pads Eb1 to Eb6 are electrically connected to the transimpedance amplifier (TIA) (not shown) provided outside the photo receiver 100 using wire bonding. By detecting the electric signal from each photodiode using the TIA, the intensity of the light entering each of photodiodes 30b1 to 30b4 is detected. The photodiodes 30b1 to 30b4 are located in the area BJ30 defining butt-joint coupling. The photodiodes 30b1 to 30b4 are PIN photodiodes, for example.

The first main surface 110s is provided with electrode pads Eb15, Eb16, Eb17, and Eb18. These electrode pads are electrically connected to the ground electrode of the TIA using wire bonding.

The output end of the spot-size converter 40c is connected to the input end of the optical demultiplexer 52c by an optical waveguide Wc. The first output end of the optical demultiplexer 52c is connected to the second input end of the optical 90-degree hybrid device 20a by an optical waveguide. The second output end of the optical demultiplexer 52c is connected to the second input end of the optical 90-degree hybrid device 20b by an optical waveguide.

According to the photo detector 100a, the first signal light SigX input to the spot-size converter 40a is input to the optical 90-degree hybrid device 20a together with the local oscillation light LO input to the spot-size converter 40c. In the optical 90-degree hybrid device 20a, the first signal light SigX is separated into four light components due to the interference of the first signal light SigX and the local oscillation light LO. The four light components are detected by the photodiodes 30a1 to 30a4, respectively. The light components detected by the photodiodes 30a1 and 30a2 are in-phase components I having phases that differ from each other by 180°. For example, the phase of the light component detected by photodiode 30a1 is 180°. The phase of the light component detected by the photodiode 30a2 is 0°. The light components detected by the photodiodes 30a3 and 30a4 are quadrature-phase components Q having phases that differ from each other by 180° and are different from the phase of the in-phase I by 90°. For example, the phase of the light component detected by the photodiode 30a3 is 270°, and the phase of the light component detected by the photodiode 30a4 is 90°.

The second signal light SigY input to the spot-size converter 40b is input to the optical 90-degree hybrid device 20b together with the local oscillation light LO input to the spot-size converter 40c. Due to the interference of the second signal light SigY and the local oscillation light LO in the optical 90-degree hybrid device 20b, the second signal light SigY is separated into four light components, as in the case of the first signal light SigX. The four light components are detected by the photodiodes 30b1 to 30b4, respectively.

Next, metal pattern layers 114, 116, and 118 provided on the second main surface 110t of the photo detector 100a will be described with reference to FIG. 3.

The metal pattern layer 114 extends along the edge (the edge extending along the Y-axis direction) of the second main surface 110t. The metal pattern layer 116 has a pair of third portions 116a and 116b extending along the X-axis direction and a fourth portion 116c disposed apart from the pair of the third portions 116a and 116b. The pair of the third portions 116a and 116b are disposed apart from each other in the Y-axis direction. The fourth portion 116c extends in the Y-axis direction between the metal pattern layer 114 and the pair of third portions 116a and 116b. The metal pattern layer 118 extends along the edge of the second main surface 110t, the edge extending in the Y-axis direction and being opposite to the edge along which the metal pattern layer 114 is provided. The metal pattern layer 116 is preferably arranged symmetrically with respect to a line (not shown) extending in the X-axis direction through the optical demultiplexer 52c. Since the two variable optical attenuators 10a and 10b are also linear symmetric with respect to the line, even if the stress caused by the metal pattern layer 116 affects the two variable optical attenuators 10a and 10b, the effect on the two variable optical attenuators becomes equal. Thus, non-uniformity in the characteristics of the two variable optical attenuators are avoided. Since the fourth portion 116c extends in the Y-axis direction, the metal pattern layer 116 can have a linear symmetry as a whole.

Next, referring to FIGS. 1, 2, 4, and 5, the carrier 100b will be described. As shown in FIGS. 1 and 2, the carrier 100b includes a supporting substrate 102 having a third main surface 102s facing the second main surface 110t and solder pattern layers 104, 106, and 108 provided on the third main surface 102s. The supporting substrate 102 has a fourth main surface 102t opposite to the third main surface 102s. Each of the third main surface 102s and the fourth main surface 102t has a rectangular shape, for example. The solder pattern layer 104 is bonded to the metal pattern layer 114. The solder pattern layer 106 is bonded to the metal pattern layer 116. The solder pattern layer 108 is bonded to the metal pattern layer 118. The supporting substrate 102 is a substrate such as an AlN substrate. The solder pattern layers 104, 106, and 108 include a solder containing AuSn, for example.

The solder pattern layer 104 extends along the Y-axis direction. The solder pattern layer 104 extends along the edge (the edge extending along the Y-axis direction) of the third main surface 102s.

The solder pattern layer 106 is disposed apart from the solder pattern layer 104 in the X-axis direction. The solder pattern layer 106 has a pair of first portions 106a and 106b extending along the X-axis direction and a second portion 106c connecting the pair of the first portions 106a and 106b. The second portion 106c is disposed apart from the solder pattern layer 104 in the X-axis direction and extends in the Y-axis direction. The pair of the first portions 106a and 106b have end portions close to the solder pattern layer 104 and are integrally connected to the second portion 106c at the end portions. Thus, the solder pattern layer 106 has a U-shape, for example.

The solder pattern layer 108 is disposed apart from the solder pattern layer 106 in the X-axis direction. The solder pattern layer 108 is provided along the edge of the third main surface 102s, the edge extending in the Y-axis direction and being opposite to the edge along which solder pattern layer 104 is provided. The solder pattern layer 108 is located at the center of the edge of the third main surface 102s in the Y-axis direction.

Next, referring to FIG. 4, the photo receiver 100 will be described when viewed in the Z-axis direction (i.e., the normal direction of first main surface 110s). As shown in FIG. 4, the solder pattern layers 104, 106, and 108 and the metal pattern layers 114, 116, and 118 are located in a peripheral area R2 surrounding a central area R1 when viewed in the Z-axis direction. The central area R1 is the area containing the center of the first main surface 110s. The peripheral area R2 is the area containing the edge of the first main surface 110s. The solder pattern layers 104, 106, and 108 and the metal pattern layers 114, 116, and 118 are not located in the central area R1. The optical demultiplexers 50a, 50b, 51a, 51b, 52a, 52b, and 52c, the variable optical attenuators 10a and 10b, the optical 90-degree hybrid devices 20a and 20b, and the photodiodes 60a, 60b, 61a, and 61b are located in the central area R1. The electrode pads Ea1 to Ea8, Ea10 to Ea18, Eb1 to Eb8, Eb10 to Eb18 and the photodiodes 30a1 to 30a4 and 30b1 to 30b4 are located in the peripheral area R2.

As shown in FIG. 4, when the first main surface 110s and the second main surface 110t are viewed in the Z-axis direction, the variable optical attenuators 10a and 10b and the optical 90-degree hybrid devices 20a and 20b are not disposed inside the edge of the metal pattern layers 114, 116, and 118. More specifically, the metal pattern layers 114, 116, and 118 and the optical demultiplexers 50a, 51a, 52a, 50b, 51b, and 52b for the variable optical attenuators 10a and 10b do not overlap when viewed in the Z-axis direction, and are separated from each other. The metal pattern layers 114, 116, and 118 and the optical demultiplexer 52c for the optical 90-degree hybrid devices 20a and 20b do not overlap when viewed in the Z-axis direction, and are separated from each other. The metal pattern layers 114, 116, and 118 and the MMI couplers 21a, 22a, 21b, and 22b of the optical 90-degree hybrid devices 20a and 20b do not overlap when viewed in the Z-axis direction, and are separated from each other. The optical properties of the optical demultiplexers and the MMI couplers are particularly sensitive to stress. Such arrangements of the metal pattern layers are useful to avoid the degradation of the optical properties of the variable optical attenuators or the optical 90-degree hybrid devices due to stress caused by the metal pattern layers.

The electrode pads Ea10, Ea7, Ea14, Ea12, Ea13, Ea11, and Ea8 are arranged adjacently to each other along the X-axis direction in this order. When viewed in the Z-axis direction, the entire electrode pads Ea10, Ea7, Ea14, Ea12, Ea13, Ea11, and Ea8 overlap with the third portion 116a of the metal pattern layer 116. When viewed in the Z-axis direction, the entire third portion 116a of the metal pattern layer 116 overlaps with the first portion 106a of the solder pattern layer 106.

The electrode pads Eb10, Eb7, Eb14, Eb12, Eb13, Eb11, and Ebb are arranged adjacently to each other along the X-axis direction in this order. When viewed in the Z-axis direction, the entire electrode pads Eb10, Eb7, Eb14, Eb12, Eb13, Eb11, and Ebb overlap with the third portion 116b of the metal pattern layer 116. When viewed in the Z-axis direction, the entire third portion 116b of the metal pattern layer 116 overlaps with the first portion 106b of the solder pattern layer 106.

The entire fourth portion 116c of the metal pattern layer 116 overlaps with the second portion 106c of the solder pattern layer 106 when viewed in the Z-axis direction. The fourth portion 116c of the metal pattern layer 116 and the second portion 106c of the solder pattern layer 106 extend in the Y-axis direction between the plurality of photodiodes 30a1 to 30a4 and 30b1 to 30b4 and the optical 90-degree hybrid devices 20a and 20b when viewed in the Z-axis direction.

When viewed in the Z-axis direction, the entire solder pattern layer 108 overlaps with the metal pattern layer 118. The solder pattern layer 108 and the metal pattern layer 118 are portions adjacent to the input port P2 when viewed in the Z-axis direction. The metal pattern layer 118 may be adjacent to the input ports P1 and P3 when viewed in the Z-axis direction.

The electrode pads Ea15, Ea1, Ea5, Ea2, Ea16, Ea17, Ea3, Ea6, Ea4, Ea18, Eb15, Eb1, Eb5, Eb2, Eb16, Eb17, Eb3, Eb6, Eb4, and Eb18 are arranged adjacently to each other along the X-axis direction in this order. When viewed in the Z-axis direction, the entire electrode pads Ea1 to Ea6, Ea15 to Ea18, Eb1 to Eb6, and Eb15 to Eb18 overlap with the metal pattern layer 114. When viewed in the Z-axis direction, the entire metal pattern layer 114 overlaps with the solder pattern layer 104.

Figure 7:
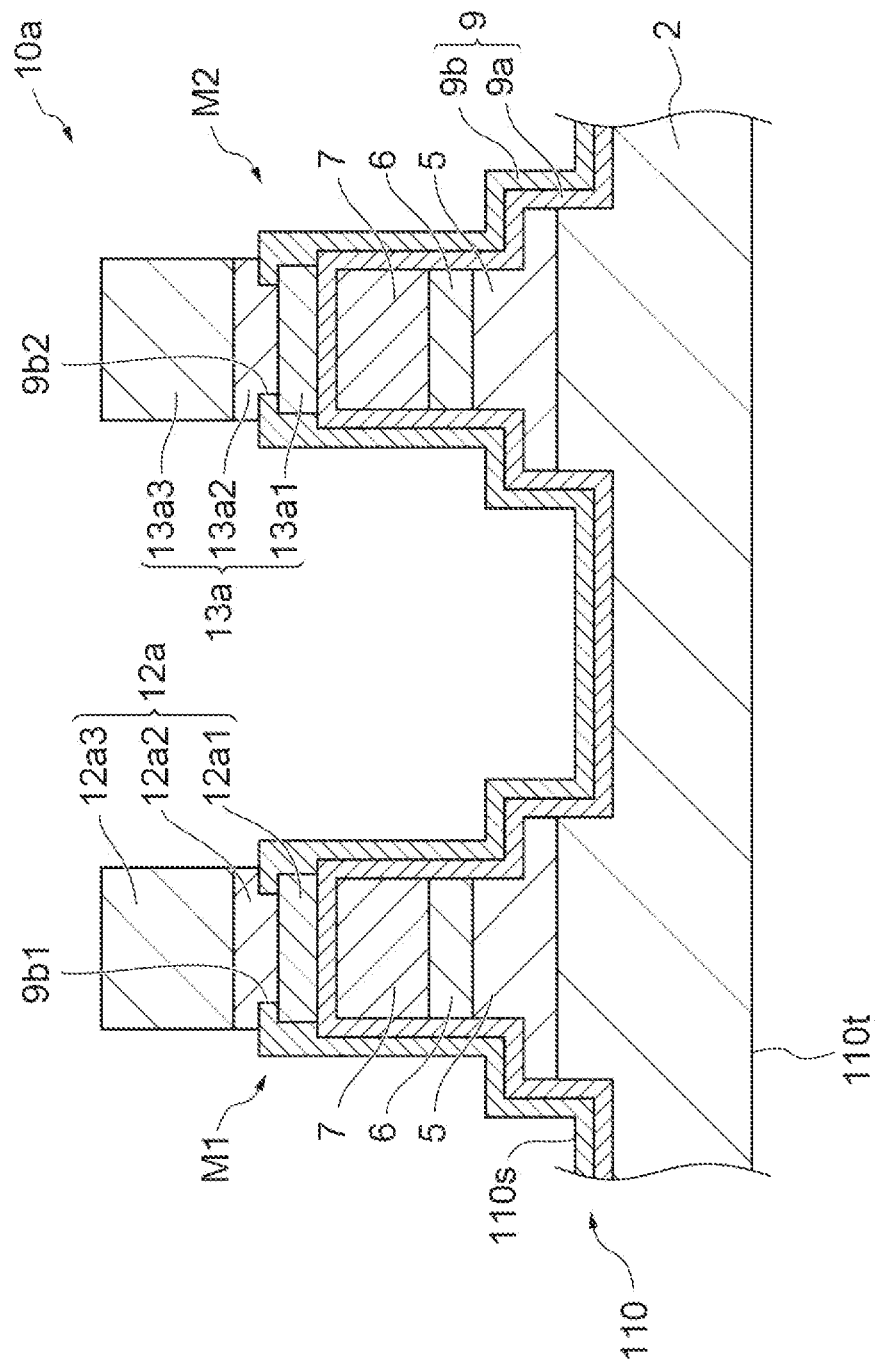
FIG. 7 is a cross-sectional view taken along the line VII-VII of FIG. 3.

FIG. 7 is a cross-sectional view taken along the line VII-VII of FIG. 3. As shown in FIG. 7, the variable optical attenuator 10a includes a pair of mesas M1 and M2 provided on the substrate 2. Each of the mesas M1 and M2 extends along an optical waveguide. The mesa M1 is heated by the heater 12a. The mesa M2 is heated by the heater 13a. In this embodiment, the power supplied to the heater 13a is larger than the power supplied to the heater 12a. By controlling the electric power supplied to the heaters 12a and 13a, the variable optical attenuator 10a can be operated.

Each of the mesas M1 and M2 includes a cladding layer 5, a core layer 6 and a cladding layer 7. The cladding layer 5 is provided on the substrate 2. The core layer 6 is provided on the cladding layer 5. The cladding layer 7 is provided on the core layer 6.

The substrate 2 is a semi-insulating III-V group semiconductor substrate such as a semi-insulating InP substrate. The cladding layer 5 is an n-type III-V group compound semiconductor such as an n-InP layer, for example. The core layer 6 is a III-V group compound semiconductor of such as an i-GaInAsP layer. The cladding layer 7 is an i-type III-V group compound semiconductor such as an i-InP layer.

The heater 12a includes a plurality of metal layers 12a1, 12a2, and 12a3 provided in this order on the top surface of the mesa M1. The metal layer 12a1 is a Ti-layer, for example. The metal layer 12a2 is a TiW-layer, for example. The metal layer 12a3 is an Au-plated layer, for example. The heater 13a includes a plurality of metal layers 13a1, 13a2, and 13a3 provided in this order on the top surface of the mesa M2. The metal layer 13a1 is a Ti-layer, for example. The metal layer 13a2 is a TiW-layer, for example. The metal layer 13a3 is an Au-plated layer, for example.

The variable optical attenuator 10a includes an insulating film 9 covering the mesas M1 and M2. The insulating film 9 includes a first insulating film 9a covering the mesas M1 and M2 and a second insulating film 9b provided on the first insulating film 9a. The first insulating film 9a is a SiN film, for example. The second insulating film 9b is a SiON film, for example. The second insulating film 9b has an opening 9b1 provided on the top surface of the mesa M1 and an opening 9b2 provided on the top surface of the mesa M2. In the present embodiment, the opening 9b1 is provided on the metal layer 12a1, and the metal layer 12a2 is embedded in the opening 9b1. Similarly, the opening 9b2 is provided on the metal layer 13a1, and the metal layer 13a2 is embedded in the opening 9b2.

The variable optical attenuator 10b also has the same configuration as the variable optical attenuator 10a. Like the mesas M1 and M2, the optical demultiplexers 50a, 50b, 51a, 51b, 52a, 52b, and 52c and the optical 90-degree hybrid devices 20a and 20b have mesas including the cladding layer 5, the core layer 6 and the cladding layer 7.

Figure 8:
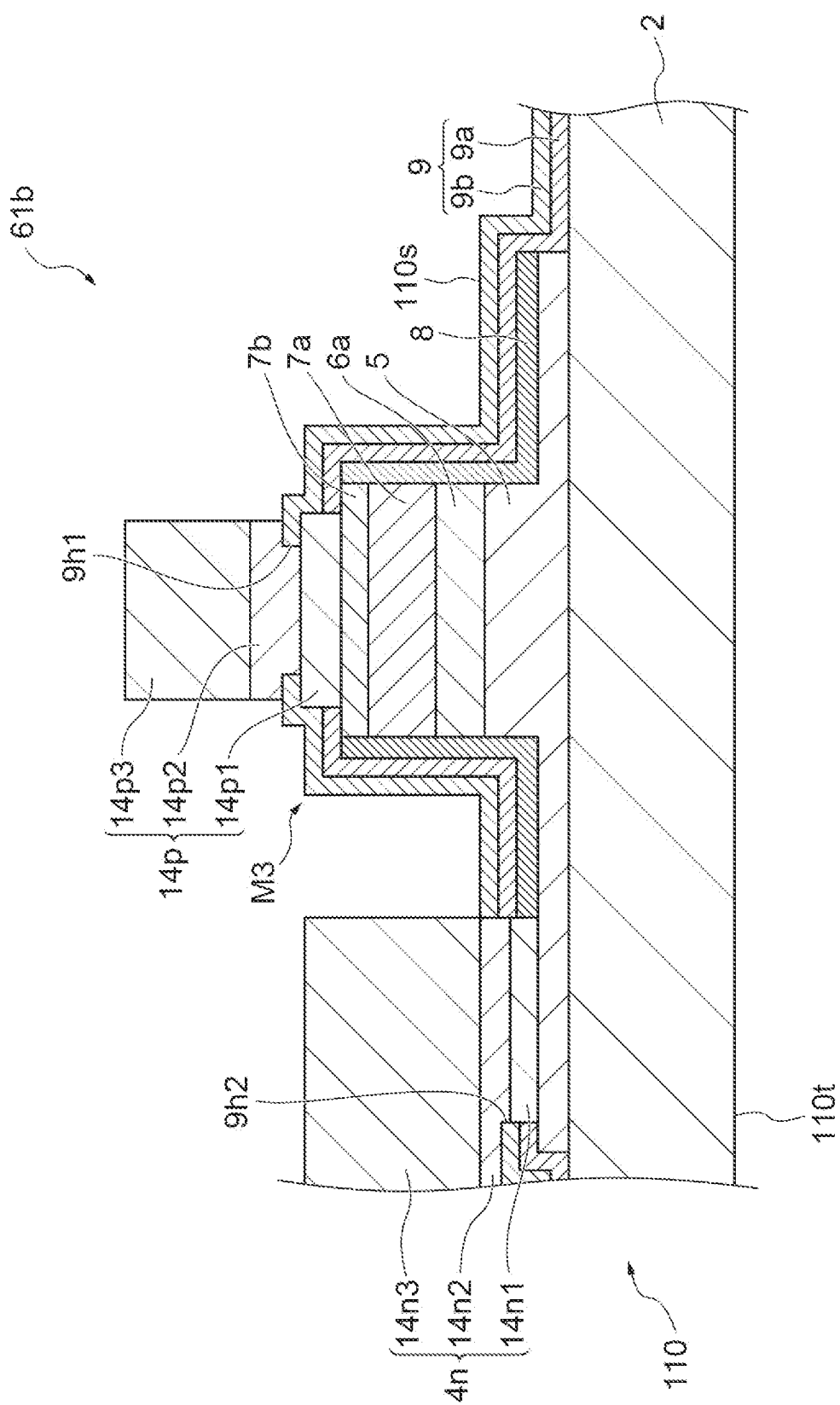
FIG. 8 is a cross-sectional view taken along the line VIII-VIII of FIG. 3.

FIG. 8 is a cross-sectional view taken along the line VIII-VIII of FIG. 3. As shown in FIG. 8, the photodiode 61b has a mesa M3 provided on the substrate 2. The mesa M3 includes the cladding layer 5, a light absorption layer 6a, a cladding layer 7a and a p-type contact layer 7b. The cladding layer 5 is provided on the substrate 2. The light absorption layer 6a is provided on the cladding layer 5. The cladding layer 7a is provided on the light absorption layer 6a. The p-type contact layer 7b is provided on the cladding layer 7a. The side surfaces of the mesa M3 are covered with a III-V group compound semiconductor layer 8 such as a Fe-doped InP layer. By using the III-V group compound semiconductor layer 8, dark current can be reduced.

In the photodiode 61b, the cladding layer 5 also functions as an n-type contact layer. The light absorption layer 6a is a III-V group compound semiconductor layer such as an i-GaInAs layer. The cladding layer 7a is a p-type III-V group compound semiconductor such as a p-InP layer. The p-type contact layer 7b is a p-type III-V group compound semiconductor layer such as a p-GaInAs layer.

The photodiode 61b includes a first electrode 14p connected to the p-type contact layer 7b and a second electrode 14n connected to the cladding layer 5. The first electrode 14p includes a plurality of metal layers 14p1, 14p2, and 14p3 which are sequentially provided on the top surface of the mesa M3. The metal layer 14p1 is an ohmic layer, for example. The metal layer 14p2 is a TiW-layer, for example. The metal layer 14p3 is an Au-plated layer, for example. The second electrode 14n includes a plurality of metal layers 14n1, 14n2, and 14n3 provided in this order on the cladding layer 5 in an area adjacent to the mesa M3. The metal layer 14n1 is an ohmic layer, for example. The metal layer 14n2 is a TiW-layer, for example. The metal layer 14n3 is an Au-plated layer, for example.

The mesa M3 is covered with the insulating film 9. The insulating film 9 includes the first insulating film 9a covering the mesa M3 and the second insulating film 9b provided on the first insulating film 9a. The insulating film 9 has an opening 9h1 on the top surface of the mesa M3 and an opening 9h2 on the cladding layer 5 in the area adjacent to the mesa M3. In the present embodiment, the opening 9h1 is provided on the metal layer 14p1, and the metal layer 14p2 is embedded in the opening 9h1. The metal layers 14n1 and 14n2 are embedded in the opening 9h2.

The other photodiodes 30a1 to 30a4, 30b1 to 30b4, 60a, 60b, and 61a have the same configuration as the photodiode 61b.

According to the photo receiver 100 of the present embodiment, the solder pattern layers 104, 106, and 108 and the metal pattern layers 114, 116, and 118 are bonded to each other, respectively by melting the solder pattern layers 104, 106, and 108 and subsequently solidifying them. At this time, since the solder pattern layers 104, 106, and 108 and the metal pattern layers 114, 116, and 118 are located in the peripheral area R2, as shown in FIG. 4, a molten solder is prevented from moving from the peripheral area R2 to the central area R1 along the surface of the metal pattern layer 114, 116, and 118. Therefore, the bonding area between the solder pattern layers 104, 106, and 108 and the metal pattern layers 114, 116, and 118 can be reduced. When the molten solder solidifies, stress is generated at the interface between the solder pattern layer and the metal pattern layer. The stress affects the optical properties of the variable optical attenuators or the optical 90-degree hybrid devices provided in the first main surface 110s via the semiconductor substrate 110. The smaller bonding area between the solder pattern layer and the metal pattern layer reduces the stress to which the photo detector 100a is subjected. Consequently, the degradation of the optical properties of the photo detector 100a caused by the stress is reduced.

The metal pattern layers 114, 116, and 118 disposed on the second main surface 110t and the optical demultiplexers 50a, 51a, 52a, 50b, 51b, and 52c disposed in the first main surface 110s do not overlap each other when viewed in the Z-axis direction. Since the optical demultiplexers and the metal layer patterns are separated from each other when viewed in the Z-axis direction, the change in the optical characteristics of the optical demultiplexers due to the stress generated in the bonding surfaces between the solder pattern layers and the metal pattern layers is suppressed.

The electrode pads Ea10, Ea7, Ea14, Ea12, Ea13, Ea11, and Ea8 overlap with the third portion 116a of the metal pattern layer 116 and the first portion 106a of the solder pattern layer 106 when viewed in the Z-axis direction. Further, when viewed in the Z-axis direction, the electrode pads Eb10, Eb7, Eb14, Eb12, Eb13, Eb11, and Ebb overlap with the third portion 116b of the metal pattern layer 116 and the first portion 106b of the solder pattern layer 106. Further, the electrode pads Ea1 to Ea6, Ea15 to Ea18, Ebb to Eb6, and Eb15 to Eb18 overlap with the metal pattern layer 114 when viewed in the Z-axis direction. Therefore, the photo detector 100a can be supported by the carrier 100b when wire bonding is performed on the respective electrode pad. As a result, the damage of the photo detector 100a due to local impact occurred during wire bonding of the electrode pads is reduced.

When the solder pattern layer 108 and the metal pattern layer 118 are bonded to each other, warpage of the photo detector 100a due to thermal expansion is suppressed in the portion adjacent to the input port P2. Therefore, for example, the deviation of the optical axis of the input port P2 along the X-axis direction (the deviation of the lens 100c2 in the Z-axis direction with respect to the optical axis due to the warpage of the photo detector 100a) can be suppressed.

When the fourth portion 116c of the metal pattern layer 116 is disposed apart from a pair of the third portions 116a and 116b, the metal pattern layer 116 is not bonded to the solder pattern layer 106 in the spaced area between the pair of the third portions 116a and 116b and the fourth portion 116c. Therefore, the bonding area between the metal pattern layer 116 and the solder pattern layer 106 can be further reduced. Therefore, the stress to which the photo detector 100a is subjected can be reduced.

The photo receiver 100 is produced as follows. First, a photo detector 100a and a carrier 100b are prepared. Next, solder pattern layers 104, 106, and 108 are melted by heating the carrier 100b. In the state in which the solder pattern layers 104, 106, and 108 are melted, metal pattern layers 114, 116, and 118 of the photo detector 100a are bonded to the solder pattern layers 104, 106, and 108, respectively.

The method for producing a photo detector 100a is explained primarily by referring to FIGS. 7 through 11B. The photo detector 100a produced, for example, as follows.

Figure 9A:
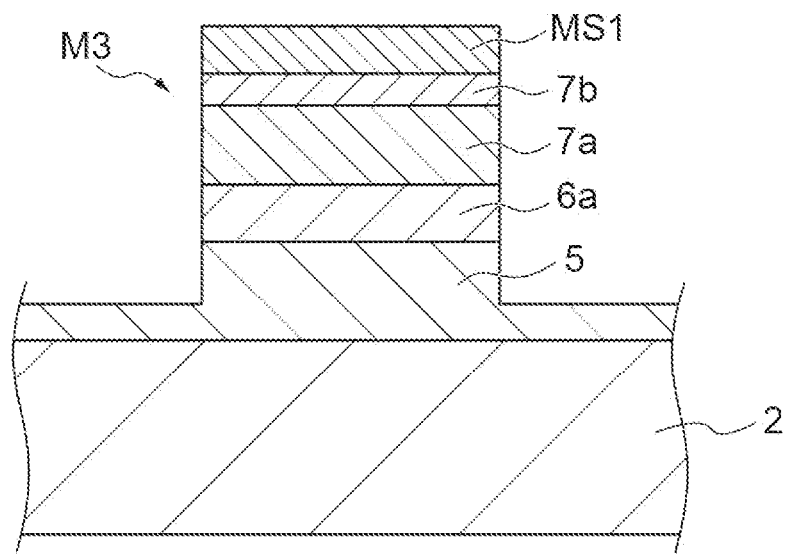
FIGS. 9A and 9B are cross-sectional views showing a step in a method for producing a photo detector.

First, a cladding layer 5, a light absorption layer 6a, a cladding layer 7a and a p-type contact layer 7b are grown in this order on a substrate 2 using organometallic vapor phase epitaxy (OMVPE) or the like (see FIG. 9A).

Next, an insulating film (e.g., a thickness of 200 nm) such as a SiN film is deposited on the p-type contact layer 7b using chemical vapor deposition (CVD) method or the like. Thereafter, a mask for butt-joint is formed by photolithography and etching (e.g., wet etching using buffered hydrofluoric acid). The mask for butt-joint is formed on areas BJ60a, BJ61a, BJ60b, BJ61b, and BJ30 (see FIG. 6). Subsequently, the light absorption layer 6a, the cladding layer 7a and the p-type contact layer 7b are etched by wet etching using a HCl-based or HBr-based etchant, for example. When the light absorption layer 6a is etched, the cladding layer 5 functions as an etching stop layer.

Figure 9B:
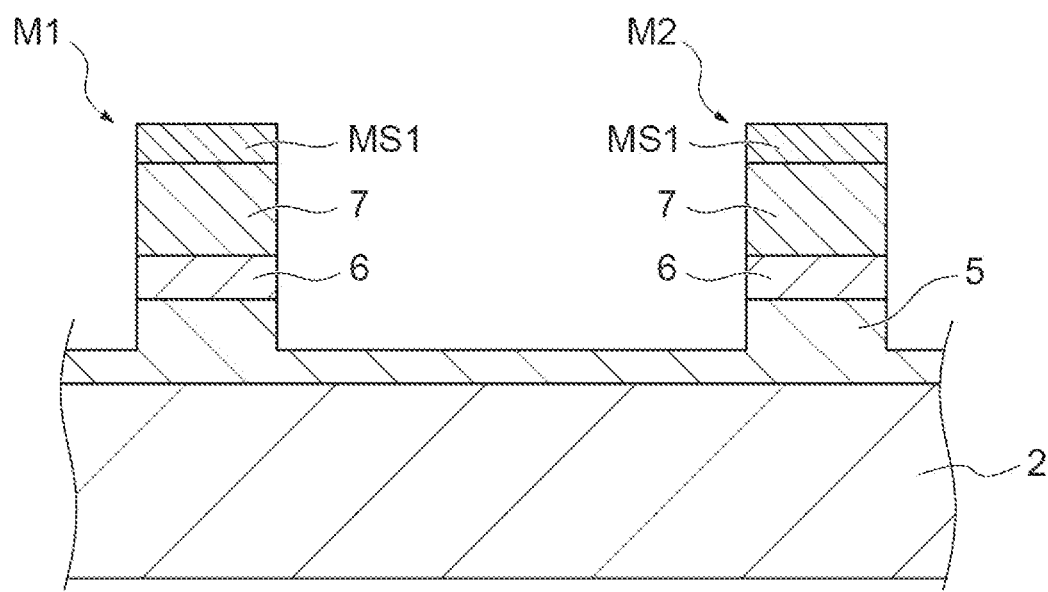
Figure 10A:
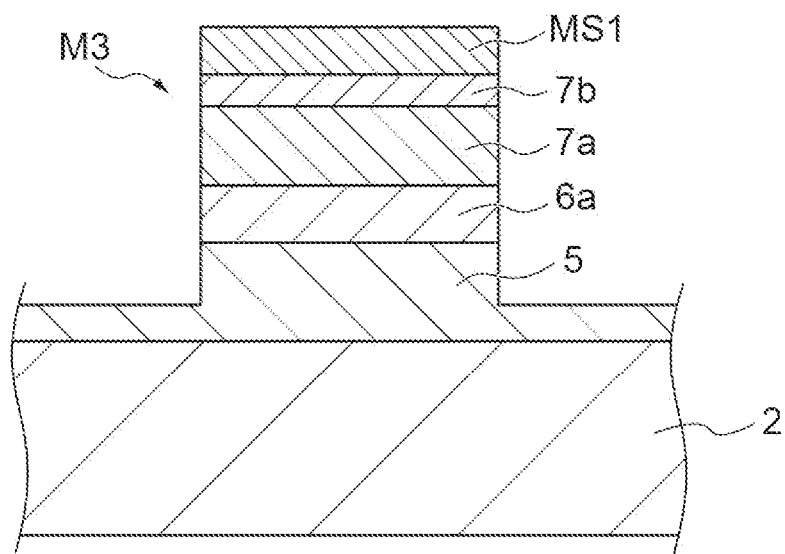
FIGS. 10A and 10B are cross-sectional views showing a step in a method for producing a photo detector.
Figure 10B:
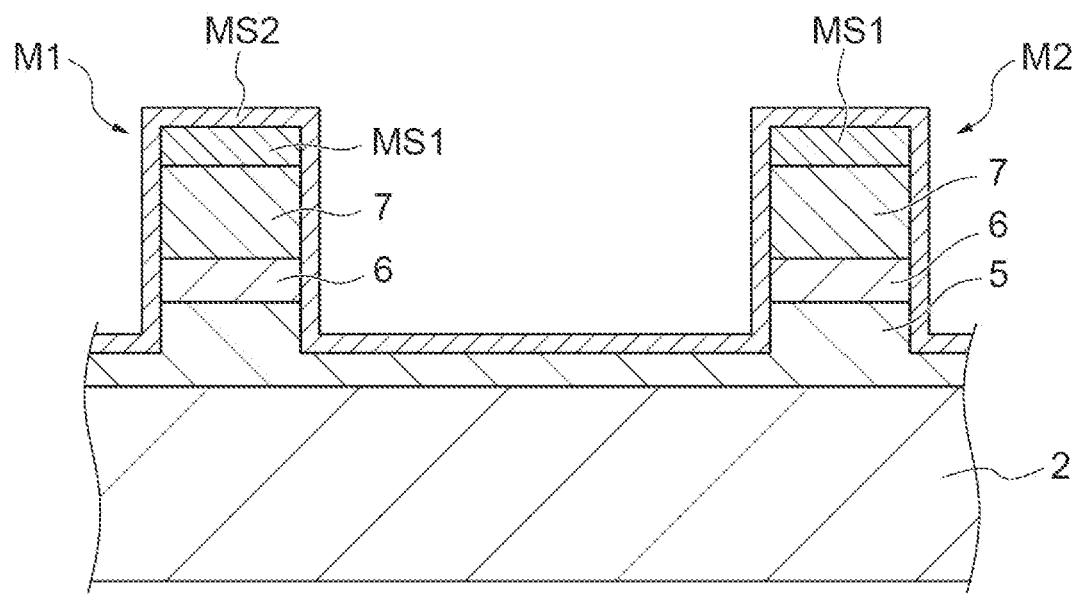
Figure 11A:
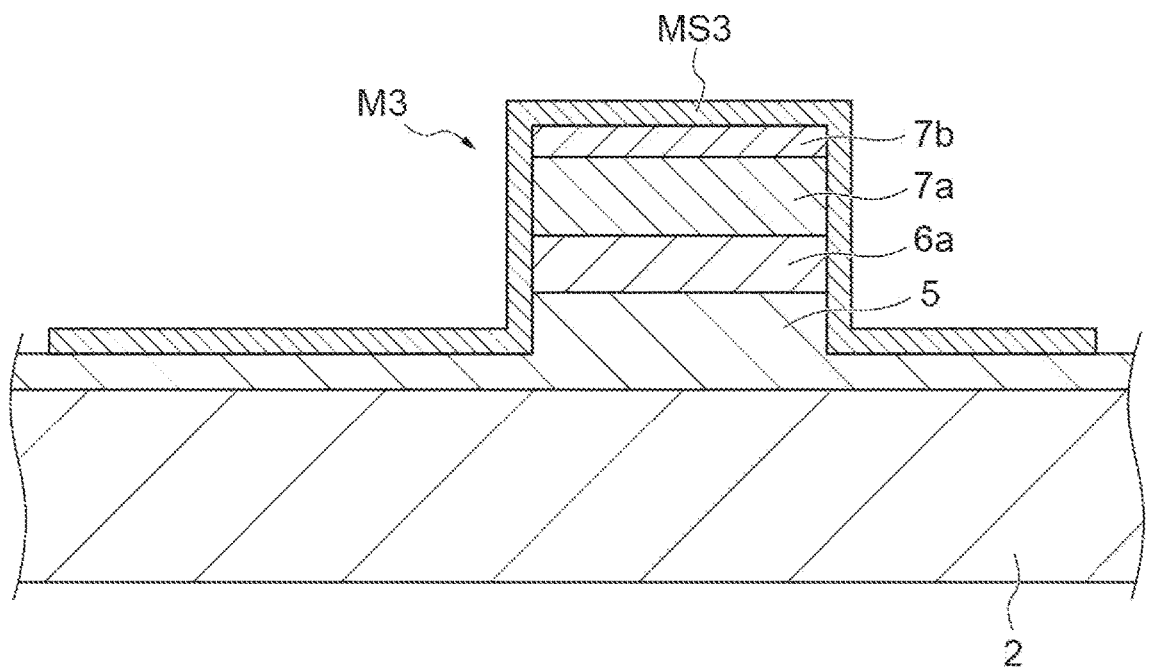
FIGS. 11A and 11B are cross-sectional views showing a step in a method for producing a photo detector.
Figure 11B:
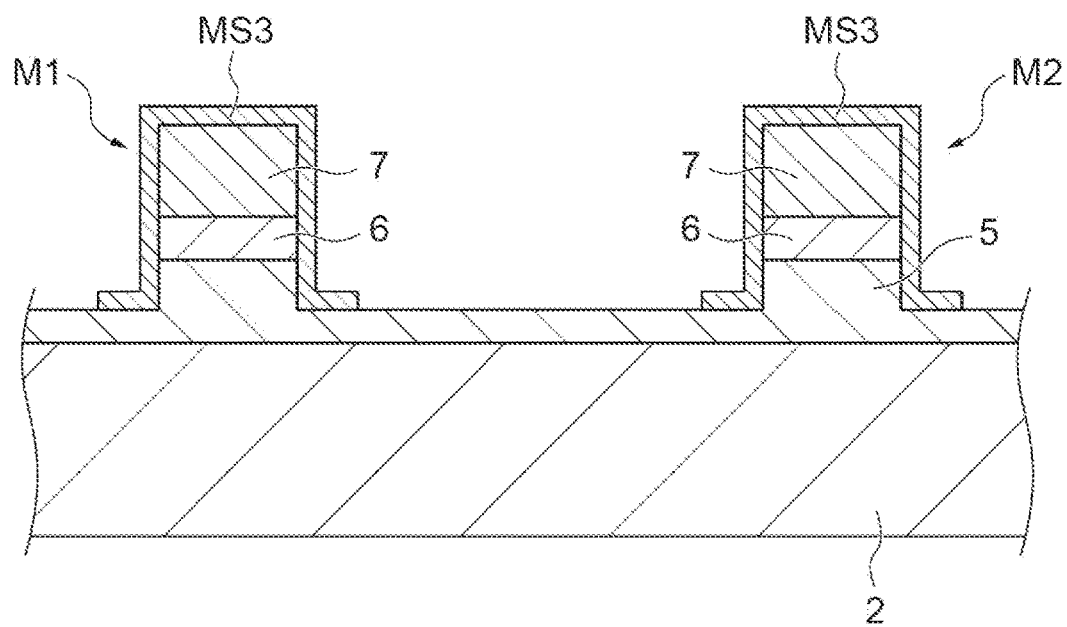

Next, a core layer 6 and a cladding layer 7 are selectively grown on a cladding layer 5 by organometallic vapor phase epitaxy (OMVPE) or the like using the mask for butt-joint (see FIG. 9B). As a result, a butt-joint coupling is formed on the edge of each area BJ60a, BJ61a, BJ60b, BJ61b, and BJ30. Subsequently, the mask for butt joint is removed.

Next, an insulating film (a thickness of 300 nm, for example) such as a SiN film or a SiO₂ film is deposited on the cladding layer 7 and the p-type contact layer 7b. Thereafter, a resist pattern for forming mesas such as the mesas M1, M2, and M3 is formed by photolithography. The resist pattern is used to form a first insulating mask MS1 by etching the insulating film with reactive ion etching (RIE) using a CF4 gas, for example (see FIGS. 9A and 9B). Using the first insulating mask MS1, the cladding layer 5, the light absorption layer 6a, the cladding layer 7a, the p-type contact layer 7b, the core layer 6 and the cladding layer 7 are etched by reactive ion etching using a Cl₂-based gas, for example. As a result, mesas such as the mesa M1, M2, and M3 are formed. In this way, the mesas included in the variable optical attenuators 10a and 10b, the optical 90-degree hybrid devices 20a and 20b, the optical demultiplexers 50a, 50b, 51a, 51b, 52a, 52b, and 52c, the optical waveguides and the photodiodes 30a1 to 30a4, 30b1 to 30b4, 60a, 60b, 61a, and 61b are formed. Unnecessary portions of the first insulating mask MS1 provided on terraces are removed by photolithography and wet etching (e.g., etching using an etchant such as buffered hydrofluoric acid). The terraces are portions having the same height as the mesas.

Next, the insulating film (e.g., 100 nm in thickness) such as a SiN film is deposited on the mesas and the first insulating mask MS1. Thereafter, a resist pattern is formed to cover mesas (e.g., mesas M1 and M2, etc.) other than the mesas included in the spot-size converters 40a, 40b, and 40c and the photodiodes 30a1, 30a4, 30b1 to 30b4, 60a, 60b, 61a, and 61b. The resist pattern is used to form a second insulating mask MS2 covering mesas (e.g., mesas M1 and M2, etc.) other than the mesas included in the spot-size converters and the photodiodes by wet etching the insulating film using an etchant such as buffered hydrofluoric acid (see FIGS. 10A and 10B). The second insulating mask MS2 is not formed on the mesa M3. Thereafter, the damaged layer formed by dry etching are removed by wet etching using a HCl-based etchant.

Next, by using the first insulating mask MS1 and the second insulating mask MS2, a III-V group compound semiconductor layer 8 is formed on the side surfaces of the mesas (e.g., mesa M3) included in the spot-size converters 40a, 40b, and 40c and the photodiodes 30a1 30a4, 30b1 to 30b4, 60a, 60b, 61a, and 61b by organometallic vapor phase epitaxy (OMVPE) or the like (see FIG. 8). Subsequently, the first insulating mask MS1 and the second insulating mask MS2 are removed by wet etching using a buffered hydrofluoric acid.

Next, after the insulating film (e.g., 300 nm in thickness) such as a SiN film is deposited on the cladding layer 5, a resist pattern is formed by photolithography to have openings between adjacent photodiodes. The resist pattern is used to form a third insulating mask MS3 having openings between adjacent photodiodes by etching the insulating film with reactive ion etching using a CF4 gas, for example (see FIGS. 11A and 11B). Using the third insulating mask MS3, the cladding layer 5 is removed by reactive ion etching using a Cl$_2$-based gas. As a result, the cladding layer 5 between the adjacent photodiodes is removed, so that the adjacent photodiodes are separated from each other. At the same time, the cladding layer 5 is also removed between the mesas M1 and M2 (see FIG. 7). Subsequently, the third insulating mask MS3 is removed.

Next, in the variable optical attenuators 10a and 10b, an insulating film 9a such as a SiN film is formed on the mesa M1, the mesa M2, and the substrate 2. Thereafter, by a lift-off method using a resist pattern having openings on the top surface of mesas M1 and M2, a metal layer 12a1 is formed on the mesa M1, and a metal layer 13a1 is formed on the mesa M2 (see FIG. 7).

Next, openings are made in the first insulating film 9a in the photodiodes 30a1 to 30a4, 30b1 to 30b4, 60a, 60b, 61a, and 61b. Thereafter, using a lift-off method, a metal layer 14p1 is formed on the mesa M3, and a metal layer 14n1 is formed in an area adjacent to the mesa M3 (see FIG. 8).

Next, the second insulating film 9b such as a SiN film or a SiON film is deposited. Thereafter, a resist pattern having openings on the metal layers 12a1, 13a1, 14p1, and 14n1 is formed by photolithography. Using the resist pattern, openings 9b1, 9b2, 9h1, and 9h2 are formed by etching the second insulating film 9b (see FIGS. 7 and 8).

Next, by photolithography, after forming a first resist pattern having openings larger than the openings 9b1, 9b2, 9h1, and 9h2, metal layers 12a2, 13a2, 14p2, and 14n2 are deposited by sputtering (see FIGS. 7 and 8). After that, a second resist pattern having the same openings as the first resist pattern is formed, and then metal layers 12a3, 13a3, 14p3, and 14n3 are deposited by plating. After removing the second resist pattern, unnecessary metal layers 12a2, 13a2, 14p2, and 14n2 are removed by reactive ion etching using a SF$_6$ gas, for example. Thereafter, the first resist pattern is removed by oxygen plasma ashing or the like.

Next, a semiconductor substrate 110 is thinned by polishing a second main surface 110t of the semiconductor substrate 110. Thereafter, a metal film is formed on a second main surface 110t of the semiconductor substrate 110 by plating or the like. The metal film includes a Pt/Au base layer and an Au-plated layer, for example. Thereafter, the metal film is etched by photolithography to form the metal pattern layers 114, 116, and 118 (see FIGS. 3 and 5). The Pt/Au base layer is dry etched, and the Au-plated layer is wet etched.

The embodiments of the present disclosure have been described above. However, the embodiments of the present disclosure disclosed above are only illustrative, and the scope of the present invention is not limited to the specific embodiments of the disclosure. It is to be understood that the scope of the present invention is defined in the appended claims and includes equivalence of the description of the claims and all changes within the scope of the claims.

What is claimed is:

1. A photo receiver comprising:
a photo detector including a semiconductor substrate having a first main surface and a second main surface opposite to the first main surface, and a metal pattern layer provided on the second main surface; and
a carrier including a supporting substrate having a third main surface facing the second main surface, and a solder pattern layer provided on the third main surface, the solder pattern layer being bonded to the metal pattern layer,
the first main surface being provided with a variable optical attenuator, an optical 90-degree hybrid device, and a plurality of photodiodes optically coupled to the variable optical attenuator via the optical 90-degree hybrid device, and
the solder pattern layer and the metal pattern layer being located in a peripheral area surrounding a central area where the variable optical attenuator and the optical 90-degree hybrid device are located when viewed in a normal direction of the first main surface,
whereby the solder pattern layer and the metal pattern layer are not located in the central area when viewed in the normal direction of the first main surface.

2. The photo receiver according to claim 1,
wherein the first main surface is provided with an input port into which a local oscillation light is inputted, the input port being optically coupled to the optical 90-degree hybrid device, and
wherein each of the solder pattern layer and the metal pattern layer includes a portion adjacent to the input port when viewed in the normal direction of the first main surface.

3. The photo receiver according to claim 1,
wherein the variable optical attenuator and the optical 90-degree hybrid device are arranged in a first direction,
wherein the solder pattern layer includes a pair of first portions extending along the first direction and a second portion connecting the pair of first portions, when viewed in the normal direction of the first main surface, and
wherein the metal pattern layer includes a pair of third portions extending along the first direction and a fourth portion disposed apart from the pair of third portions, when viewed in the normal direction of the first main surface.

4. The photo receiver according to claim 3, wherein the second portion extends along a direction intersecting the first direction, when viewed in the normal direction of the first main surface, and the fourth portion extends along a direction intersecting the first direction, when viewed in the normal direction of the first main surface.

5. The photo receiver according to claim 3,
wherein one of the third portions entirely overlaps with one of the first portions when viewed in the normal direction of the first main surface,
wherein the other of the third portions entirely overlaps with the other of the first portions when viewed in the normal direction of the first main surface, and
wherein the fourth portion entirely overlaps with the second portion when viewed in the normal direction of the first main surface.

* * * * *